United States Patent [19]

Parnell

[11] Patent Number: 4,912,420
[45] Date of Patent: Mar. 27, 1990

[54] COMPARATOR CIRCUITS

[75] Inventor: Richard J. Parnell, Bracknell, England

[73] Assignee: British Aerospace Public Limited Company, London, England

[21] Appl. No.: 216,482

[22] Filed: Jul. 8, 1988

[30] Foreign Application Priority Data

Jul. 9, 1987 [GB] United Kingdom ............... 8716144

[51] Int. Cl.⁴ .............................................. G06G 7/14
[52] U.S. Cl. ................................. 328/147; 307/272.1; 307/265; 307/768; 307/351; 328/151
[58] Field of Search ............... 307/491, 494, 351, 265, 307/268, 601, 602, 354, 359, 272.1; 328/146–149, 150, 112, 151

[56] References Cited

U.S. PATENT DOCUMENTS

| 3,513,400 | 5/1970 | Russell | 328/147 |
| 3,668,532 | 6/1972 | Potash | 328/151 |
| 3,683,284 | 8/1972 | Mueller | 328/117 |
| 3,737,790 | 6/1973 | Brown | 307/359 |
| 3,743,945 | 7/1973 | Sellari | 328/28 |
| 4,086,538 | 4/1978 | Foreman | 328/112 |
| 4,418,332 | 11/1983 | Mefford | 328/147 |
| 4,475,210 | 10/1984 | Couch | 328/147 |

FOREIGN PATENT DOCUMENTS

| 0060324 | 9/1982 | European Pat. Off. . |
| 1322758 | 7/1973 | United Kingdom . |
| 1390261 | 4/1975 | United Kingdom . |
| 1523883 | 9/1978 | United Kingdom . |
| 1564416 | 4/1980 | United Kingdom . |
| 1575445 | 9/1980 | United Kingdom . |
| 1588757 | 4/1981 | United Kingdom . |
| 1603554 | 11/1981 | United Kingdom . |
| 2104756 | 3/1983 | United Kingdom . |
| 2135856 | 9/1984 | United Kingdom . |

Primary Examiner—Stanley D. Miller
Assistant Examiner—Nancy Thai
Attorney, Agent, or Firm—Cushman, Darby & Cushman

[57] ABSTRACT

Comparator means comprising a pair of comparators connected to a logic gate and bistable circuit, said comparators are connected in anti-phase with a common input and separate outputs the separate outputs are combined by the logic gate to produce a single switching signal which is used to trigger the bistable to produce an output signal.

8 Claims, 3 Drawing Sheets

| NOR GATE | INPUT B | INPUT C | OUTPUT |
|---|---|---|---|
| | 0 | 0 | 1 |
| | 0 | 1 | 0 |
| | 1 | 0 | 0 |
| | 1 | 1 | 0 |

COMPARATOR CIRCUITS

BACKGROUND OF THE INVENTION

1. Field of the Invention

This invention relates to the minimizing of timing errors in electronic circuits and particularly to improving the performance of comparator circuits used when converting an arbitrary wave shape to a binary waveform.

2. Description of the Prior Art

Comparator circuits normally exhibit significant differences in time delay when switching, dependent on whether the output is transversing high to low or low to high, associated with the turn on and turn off delays of the output device. These delays are determined by different electrical mechanisms and hence also vary differently with temperature.

FIG. 4 shows a conventional comparator, identifying the input signals $V_1$ and $V_2$ and the output signal $V_3$, and FIG. 5 shows the signals associated with the comparator in FIG. 4.

A conventional comparator circuit will exhibit a time delay between when $V_1$ exceeds $V_2$ and the output voltage $V_3$ starting to change (rise), say $t_1$, further there will be a finite time between the output voltage starting to change and when it has finished changing, say $t_2$.

There will be another time delay between $V_1$ falling below $V_2$ & $V_3$ starting to fall, say $t_3$ and a further finite time between when $V_3$ starts to fall and has finished changing, say $t_4$. Normally $t_1$ does not equal $t_3$, neither does $t_2$ equal $t_4$ nor does $(t_1+t_2)-(t_3+t_4)$; further $t_1, t_2, t_3$ and $t_4$ will all change as the temperature varies and by differing amounts as they are determined by different mechanisms.

One effect of these differing time delays is to make it appear that the comparator has different reference voltages for positive going inputs and negative going inputs (akin to hysteresis and further that these references vary with temperature. Using high speed devices can reduce the effect at the expense of large increases in power.

SUMMARY OF THE INVENTION

It is an object of the present invention to provide a comparator circuit in which such differential time delay variations are minimized.

According to one aspect of this invention there is provided comparator means comprising at least two comparators having a common input and separate outputs and which are arranged so that an input signal causes an output signal from each output, said output signals being of the opposite sense.

Thus the effective propagation delay (i.e. the time taken from arrival of the input signal to departure of the output signal) is the shortest of the two possible delay mechanisms so that any thermal variation is likely to be smaller and the differential delay is effectively nulled and differential thermal variations rendered negligible.

The invention allows use of lower power devices, minimizing the delays and virtually eliminates the time differences. The residual temperature dependencies are closely matched.

In an embodiment to be described the comparator means comprises a pair of comparators connected via a logic gate to a bistable circuit, said comparators being connected in anti-phase, wherein the separate comparator outputs are combined by the logic gate to produce a single switching signal for triggering the bistable circuit. Thus, this embodiment involves the use of two nominally identical comparator circuits with the inputs of one reversed. The separate outputs are combined by a logic gate to produce pulses at twice the requested output frequency which may be used to toggle a logic flip-flop circuit to give the requested output waveform with identical delays for both high to low and low to high transitions. Since the delay mechanisms involved are identical in nature the actual delays will track or follow each other with variations in temperature.

The technique actually utilizes the differing switching delays of the basic comparators to generate pulses suitable for triggering the bistable. As such, comparators with larger timing differences are better suited to the technique since the pulse length must be adequate to propagate through the logic circuits. The matching inherent in integrated circuits, particularly when utilizing two comparators in a common package, gives excellent behaviour over a wide temperature range in excess of that achievable by a high speed comparator with lower absolute timing errors consuming considerably more power.

Brief Description of the Drawings

Specific embodiments of the invention will now be described with reference to the following drawings of which.

DETAILED DESCRIPTION OF THE PREFERRED EMBODIMENT

Figure 1:
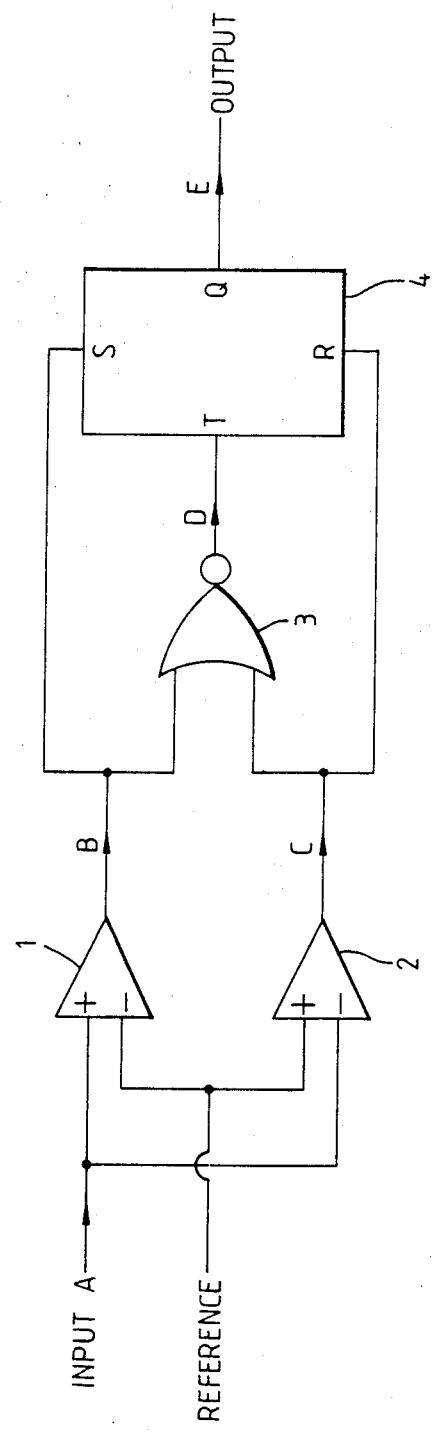
FIG. 1 is a schematic diagram of a first embodiment of the invention.

As shown in FIG. 1 the invention comprises a pair of comparators 1 and 2 which are arranged in anti-phase with respect to each other and connected to a NOR gate 3 and a bistable circuit 4. An input signal A is fed into the non-inverting input of one of the comparators 1 and the same signal is simultaneously fed into the inverting input of the other comparator 2. The two comparators 1 and 2 produce output signals B and C respectively. The two signals B and C are combined by NOR gate 3 to produce output signal D which is used to trigger the bistable 4 via its trigger input T. An advantage of this arrangement is that, because the two signals B and C are produced in anti-phase one of the two signals will always be a fast changing high to low level signal which can be used to achieve fast switching of the bistable 4. Signal D is generated at twice the frequency of the input signal A but in the course of triggering bistable 4 it produces a resultant signal E of the required frequency, i.e. the same frequency as signal A. To ensure that the output signal E is in phase with the original input signal A the two comparator signals B and C are connected to the set and reset inputs, S and R, respectively of the bistable 4. When the arrangement is first switched on the bistable will latch so that the voltage of the output Q will correspond to the voltage of the input signal A, thereafter switching of the bistable 4 is controlled entirely by the voltages present at the trigger input T of the bistable 4.

Figures 2, 3:
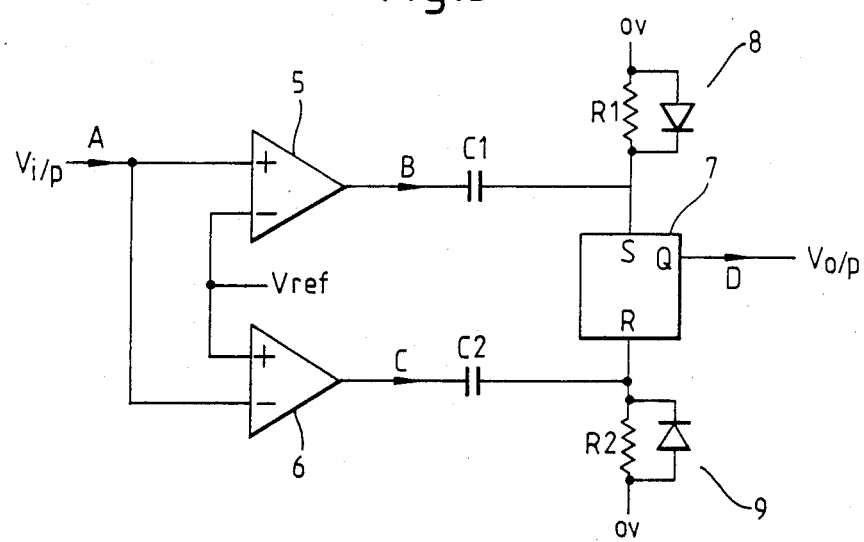
FIG. 2 is a NOR gate TRUTH TABLE.
FIG. 3 shows schematically a second embodiment of the invention.
Figure 4:
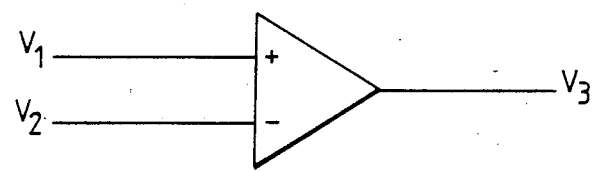
FIGS. 4 and 5 show a conventional comparator and associated signals.
Figure 5:
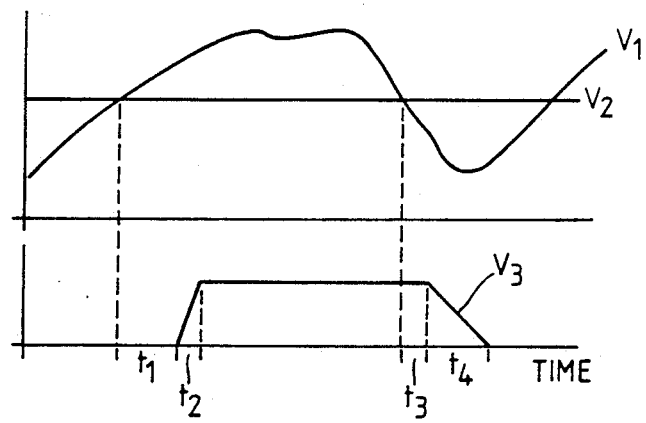

As shown in FIG. 3, a pair of comparators 5 and 6 arranged in anti-phase are connected to a bistable circuit in the form of a Set-Reset flip-flop 7 via capacitors $C_1$ and $C_2$ respectively. Bias and signal limiting components indicated at 8 and 9 and including resistors $R_1$ and $R_2$ are provided to protect the signal components.

When an input signal A is fed to the non-inverting input of comparator 5 and to the inverting input of comparator 6, the two comparators produce output signals B and C respectively which are supplied via capacitors $C_1$ and $C_2$ to the set and reset inputs of the flip-flop 7 which produces an output D. The flip-flop 7 sets Q to high by virtue of a (momentary) high on 5 and resets Q to low by virtue of a (momentary) high on R. In this case, each of the inputs to the flip-flop 7 toggles the bistable in one direction only by means of a transition but does not affect the output state by virtue of its level.

The polarity correction that may be required at switch on is implemented automatically by the first change of state of comparators 5 and 6 as only one of the coupled edges will toggle the flop-flop 7 and it must be in the required sense.

It will be understood that other arrangements in which the comparators are connected to a bistable circuit solely by ac coupling are also possible, e.g. a transformer may be used or a resistive coupling.

The invention is concerned with the circumventing errors introduced in converting an analogue signal to a two state (binary) sugnal and is not converned with the nature (amplitude or signal to noise ratio) of the incoming analogue signal or the reference voltage. It exploits an inherent shortcoming of a conventional comparator system in a configuration that exhibits a minimal such error overall.

I claim:

1. Comparator means comprising:
   at least two comparators, having a common input and separate outputs, constructed so that an input signal causes an output signal from each output, said output signals being of the opposite sense;
   a bistable circuit connected to the outputs of the comparators, said comparators being connected in anti-phase, with the separate comparator outputs being combined by said bistable circuit to produce a single switching signal, and wherein the comparators are connected to the bistable circuit via logical gating operable to combine the comparator outputs to a single signal to be supplied to the toggle input of the bistable circuit.

2. Comparator means according to claim 1 wherein the logical gating comprises a NOR gate.

3. A comparator circuit for supplying a binary signal indicative of whether the level of a received analog input signal is greater or less than a predetermined reference level, the comparator circuit comprising:
   input means for receiving said analog input signal;
   reference level defining means for making available said predetermined reference level;
   first and second comparator amplifiers each having an inverting input and a non-inverting input, the inverting input of the first comparator amplifier and the non-inverting of the second being connected to said input means and the non-inverting input of the first comparator amplifier and the inverting input of the second being connected to said reference level defining means for the two comparator amplifiers to produce conjugate binary output signals which undergo transitions between a high and a low level in respective opposite directions in response to each of any crossings of the reference level by the input signal level; and
   logic circuit means including a bistable device coupled to the comparator amplifiers for switching between the two output states of the bistable device to be initiated, following any one of said reference level crossings, by that one of the resultant comparator amplifier output signal transitions which is in a predetermined one of said directions.

4. A comparator circuit according to claim 3, wherein, for each comparator amplifier, output level transitions in said opposite directions become fully executed after respective different response times following each reference level crossing and wherein said predetermined one of said directions is the one for which the response time is least.

5. A comparator circuit according to claim 3, wherein said bistable device has a clock input and the bistable device is operable for being toggled between its two output states by pulse signals received at its clock input, said logic circuit means further including a NOR gate having inputs connected to outputs of respective ones of the comparator amplifiers and an output connected to the clock input of the bistable device.

6. A comparator circuit according to claim 5, wherein said bistable device further comprises a set input and a reset input and the device is operable for being set into one of its output states by a set signal received at its set input and for being reset to its other output state by a reset signal received at its reset input, said set and reset inputs being connected to the outputs of respective ones of the comparator amplifiers.

7. A comparator circuit according to claim 3, wherein said bistable device comprises a set input and a reset input and the device is operable for being set into one of its output states by a set signal received at its set input and for being reset to its other output state by a reset signal received at its reset input, said set and reset input being connected to the outputs of the comparator amplifiers via ac coupling components, with the logic circuit means further including rectifier diodes connected to said set and reset inputs of the bistable device for limiting a magnitude of any pulses having one polarity received from the ac coupling components while not limiting pulses having an opposite polarity.

8. A comparator according to claim 7, wherein said ac coupling components comprise respective capacitors connected in series between the outputs of the comparator amplifiers and the associated inputs of the bistable device, and respective resistors connected between the inputs of the bistable device and a common zero potential conductor of the circuit, said rectifier diodes being connected in parallel with respective ones of said resistors.

* * * * *